(12) United States Patent
Shen et al.

(10) Patent No.: US 6,797,188 B1
(45) Date of Patent: Sep. 28, 2004

(54) SELF-CLEANING PROCESS FOR ETCHING SILICON-CONTAINING MATERIAL

(76) Inventors: Meihua Shen, 694 Perry Common, Fremont, CA (US) 94539; Wei-nan Jiang, 3089 Etruscan Dr., San Jose, CA (US) 94040; Oranna Yauw, 777 S. Mathilda Ave. #136, Sunnyvale, CA (US) 94087; Jeffrey Chinn, 605 St. Croix La., Foster City, CA (US) 94404

( * ) Notice: Subject to any disclaimer, the term of this patent is extended or adjusted under 35 U.S.C. 154(b) by 0 days.

(21) Appl. No.: 09/507,629

(22) Filed: Feb. 18, 2000

Related U.S. Application Data

(63) Continuation-in-part of application No. 09/116,621, filed on Jul. 16, 1998, now Pat. No. 6,322,714, and a continuation-in-part of application No. 08/969,122, filed on Nov. 12, 1997, now Pat. No. 6,136,211.

(51) Int. Cl.⁷ .............................................. H01L 21/00
(52) U.S. Cl. ............................ 216/46; 216/67; 216/79; 134/1.1; 134/21; 134/22.1; 438/696; 438/721; 438/723; 438/724; 438/905
(58) Field of Search ............................... 216/2, 37, 46, 216/67, 79; 134/1.1, 21, 22.1; 438/696, 721, 723, 724, 905

(56) References Cited

U.S. PATENT DOCUMENTS

| | | | |
|---|---|---|---|
| 4,282,267 A | 8/1981 | Kuyel | 427/38 |
| 4,433,228 A | 2/1984 | Nishimatsu et al. | 219/10.55 R |
| 4,465,532 A | 8/1984 | Fukano | 156/643 |
| 4,490,209 A | 12/1984 | Hartman | 156/643 |
| 4,502,914 A | 3/1985 | Trumpp et al. | 156/643 |
| 4,576,692 A | 3/1986 | Fukuta et al. | 204/165 |
| 4,705,595 A | 11/1987 | Okudaira et al. | 156/643 |
| 4,738,748 A | 4/1988 | Kisa | 156/643 |
| 4,786,553 A | 11/1988 | Benzing | 156/345 |
| 4,799,991 A | 1/1989 | Dockrey | 438/719 |
| 4,818,326 A | 4/1989 | Liu et al. | 156/345 |
| 4,831,963 A | 5/1989 | Saito et al. | 118/723 |
| 4,863,561 A | 9/1989 | Freeman et al. | 156/646 |
| 4,867,841 A | 9/1989 | Loewenstein et al. | 156/643 |
| 4,876,212 A | 10/1989 | Koury | 437/34 |
| 4,975,144 A | 12/1990 | Yamazaki et al. | 156/643 |
| 4,992,134 A * | 2/1991 | Gupta et al. | 204/192.37 |
| 4,992,136 A | 2/1991 | Tachi et al. | 156/643 |

(List continued on next page.)

FOREIGN PATENT DOCUMENTS

| | | |
|---|---|---|
| DE | 4132559 | 4/1993 |
| EP | 0200951 | 4/1986 |
| EP | 0273143 | 6/1988 |
| EP | 0314990 | 6/1989 |
| EP | 0463373 | 1/1992 |
| EP | 0516043 | 12/1992 |

(List continued on next page.)

OTHER PUBLICATIONS

Aydil, et al. "Multiple Steady States in a Radio Frequency Chlorine Glow Discharge," *J. Appl. Phys.*, vol. 69, No. 1, Jan. 1, 1991, pp. 109–114.

Hillenius, S.J., et al., "A Symmetric Submicron CMOS Technology," *IEEE*, pp. 252–255, 1986.

(List continued on next page.)

*Primary Examiner*—Allan Olsen
(74) *Attorney, Agent, or Firm*—Janah & Associates; Joseph Bach

(57) ABSTRACT

A method of etching a silicon-containing material in a substrate comprises placing the substrate in a process chamber and exposing the substrate to an energized gas comprising fluorine-containing gas, chlorine-containing gas and sidewall-passivation gas. The silicon-containing material on the substrate comprises regions having different compositions, and the volumetric flow ratio of the fluorine-containing gas, chlorine-containing gas, and sidewall-passivation gas is selected to etch the compositionally different regions at substantially similar etch rates.

72 Claims, 3 Drawing Sheets

U.S. PATENT DOCUMENTS

| | | | |
|---|---|---|---|
| 4,994,410 A | 2/1991 | Sun et al. ................... | 437/192 |
| 5,002,632 A | 3/1991 | Loewenstein et al. ...... | 156/643 |
| 5,013,398 A | 5/1991 | Long et al. ................. | 156/643 |
| 5,035,768 A | 7/1991 | Mu et al. .................... | 156/626 |
| 5,084,126 A | 1/1992 | McKee ....................... | 156/345 |
| 5,094,712 A | 3/1992 | Becker et al. .............. | 156/643 |
| 5,110,408 A | 5/1992 | Fujii et al. .................. | 156/643 |
| 5,110,411 A | 5/1992 | Long ........................... | 156/656 |
| 5,118,387 A | 6/1992 | Kadomura ................... | 156/657 |
| 5,158,644 A | 10/1992 | Cheung et al. .............. | 156/643 |
| 5,160,407 A | 11/1992 | Latchford et al. .......... | 156/656 |
| 5,164,330 A | 11/1992 | Davis et al. ................. | 437/192 |
| 5,176,792 A | 1/1993 | Fullowan et al. ........... | 156/652 |
| 5,180,464 A | 1/1993 | Tatsumi et al. | |
| 5,188,980 A | 2/1993 | Lai ............................. | 437/193 |
| 5,192,702 A | 3/1993 | Tseng .......................... | 437/47 |
| 5,207,836 A | 5/1993 | Chang .......................... | 134/1 |
| 5,219,485 A | 6/1993 | Wang et al. ................. | 252/79.3 |
| 5,256,245 A | 10/1993 | Keller et al. ................. | 156/643 |
| 5,259,923 A | 11/1993 | Hori et al. ................... | 156/643 |
| 5,281,302 A | 1/1994 | Gabric et al. ................ | 156/643 |
| 5,282,899 A | 2/1994 | Balmashnov et al. ... | 118/723 R |
| 5,312,519 A | 5/1994 | Sakai et al. .................... | 134/1 |
| 5,318,668 A | 6/1994 | Tamaki et al. .............. | 156/662 |
| 5,338,398 A | 8/1994 | Szwejkowski et al. ...... | 156/655 |
| 5,354,416 A | 10/1994 | Okudaira et al. ........... | 156/643 |
| 5,354,417 A | 10/1994 | Cheung et al. .............. | 156/643 |
| 5,356,478 A | 10/1994 | Chen et al. ................... | 134/1 |
| 5,358,601 A | 10/1994 | Cathey ........................ | 156/656 |
| 5,378,311 A | 1/1995 | Nagayama et al. ......... | 156/643 |
| 5,382,316 A | 1/1995 | Hills et al. ................... | 156/643 |
| 5,384,009 A | 1/1995 | Mak et al. | |
| 5,389,197 A | 2/1995 | Ishimaru ..................... | 156/643 |
| 5,413,954 A | 5/1995 | Aydil et al. .................... | 437/81 |
| 5,431,772 A | 7/1995 | Babie et al. ............. | 156/643.1 |
| 5,443,686 A | 8/1995 | Jones et al. .................... | 216/37 |
| 5,449,411 A | 9/1995 | Fukuda et al. ......... | 118/723 MP |
| 5,514,622 A | 5/1996 | Bornstein et al. ........... | 437/189 |
| 5,521,119 A | 5/1996 | Chen et al. .................. | 437/187 |
| 5,529,197 A | 6/1996 | Grewal ........................ | 216/68 |
| 5,605,601 A * | 2/1997 | Kawasaki ................... | 438/695 |
| 5,620,614 A | 4/1997 | Keller ......................... | 438/720 |
| 5,626,775 A | 5/1997 | Roberts et al. .............. | 216/67 |
| 5,637,237 A | 6/1997 | Oehrlein et al. ............. | 216/67 |
| 5,644,153 A | 7/1997 | Keller ......................... | 257/324 |
| 5,651,856 A | 7/1997 | Keller et al. ............. | 156/643.1 |
| 5,700,741 A | 12/1997 | Liao ........................... | 438/723 |
| 5,716,495 A * | 2/1998 | Butterbaugh et al. .......... | 134/1 |
| 5,741,396 A | 4/1998 | Loewenstein ............ | 156/643.1 |
| 5,753,533 A | 5/1998 | Saito .......................... | 437/192 |
| 5,756,400 A | 5/1998 | Ye et al. ..................... | 438/710 |
| 5,767,021 A | 6/1998 | Imai et al. ................... | 438/719 |
| 5,788,778 A | 8/1998 | Shang et al. ................... | 134/1 |
| 5,788,799 A | 8/1998 | Steger et al. ................ | 156/345 |
| 5,811,022 A | 9/1998 | Savas et al. .................. | 216/68 |
| 5,817,534 A | 10/1998 | Ye et al. ....................... | 438/10 |
| 5,843,239 A | 12/1998 | Shrotriya .................... | 134/1.1 |
| 5,849,092 A | 12/1998 | Xi et al. ..................... | 134/1.1 |
| 5,861,233 A | 1/1999 | Sekine et al. | |
| 5,874,363 A | 2/1999 | Hoh et al. ................... | 438/721 |
| 5,879,575 A | 3/1999 | Tepman et al. .............. | 216/68 |
| 5,939,831 A * | 8/1999 | Fong et al. .............. | 315/111.21 |
| 6,026,762 A * | 2/2000 | Kao et al. ............. | 118/723 ME |
| 6,029,602 A * | 2/2000 | Bhatnagar ............. | 118/723 ME |
| 6,039,834 A * | 3/2000 | Tanaka et al. ......... | 156/345.36 |
| 6,045,618 A * | 4/2000 | Raoux et al. ................ | 118/715 |
| 6,079,426 A * | 6/2000 | Subrahmanyam et al. ... | 134/1.1 |
| 6,090,718 A | 7/2000 | Hajime et al. ............... | 438/714 |
| 6,125,859 A | 10/2000 | Kao et al. | |
| 6,170,428 B1 * | 1/2001 | Redeker et al. ........... | 118/723 I |
| 6,182,602 B1 * | 2/2001 | Redeker et al. ......... | 118/723 R |
| 6,270,634 B1 | 8/2001 | Kumar et al. | |

FOREIGN PATENT DOCUMENTS

| | | |
|---|---|---|
| EP | 0355546 | 8/1993 |
| EP | 0697467 | 2/1996 |
| EP | 0709877 | 5/1996 |
| EP | 0746015 | 12/1996 |
| EP | 0790635 | 2/1997 |
| EP | 0837497 | 4/1998 |
| JP | 62040728 | 8/1985 |
| JP | 01050427 | 2/1989 |
| JP | 6177092 | 6/1994 |
| JP | 7029870 | 1/1995 |
| JP | 1023387 | 9/1998 |
| WO | 9615545 | 5/1996 |

OTHER PUBLICATIONS

PCT Notification of International Search Report dated Oct. 28, 1999.

PCT Notification of International Search Report dated Feb. 4, 1999.

PCT Report dated Jun. 22, 2001, European Patent Office, P.B. 5818 Patentlaan 2 NL–2280 HV Rijswijk.

Zaleskl, et al "Tungsten Silicide/Polysilicon Stack Etching using Mixed Fluorine Chlorine Chemistry in a High Density Plasma Chamber", *Electrochemical Society Proceedings* vol. 98–4, pp. 203–209.

PCT Search Report dated Nov. 8, 2000.

* cited by examiner

SELF-CLEANING PROCESS FOR ETCHING SILICON-CONTAINING MATERIAL

CROSS-REFERENCE

This application is a continuation-in-part of U.S. patent application Ser. No. 09/116,621, entitled "Process for Etching Silicon-Containing Layers on Semiconductor Substrates," filed on Jul. 16, 1998 now U.S. Pat No. 6,322,714; which is a continuation-in-part of and U.S. patent application Ser. No. 08/969,122, entitled "Self-Cleaning Etch Process," filed on Nov. 12, 1997 now U.S. Pat. No. 6,136,211 both of which are incorporated herein by reference.

BACKGROUND

The present invention relates to etching a silicon-containing material on a substrate.

In the manufacturing of electronic components, such as integrated circuits and flat panel displays, silicon-containing layers, such as silicon dioxide, silicon nitride, polysilicon, metal silicide, and monocrystalline silicon layers, are formed on a substrate. These materials may be etched, for example, to form gates, vies, contact holes, trenches, and/or interconnect lines. In the etching process, a patterned mask of silicon dioxide, silicon nitride or etch resistant polymer is formed on the substrate by conventional lithographic methods. The substrate is placed in an etching chamber and portions of the underlying silicon-containing layer which are exposed through the mask are etched, for example, by an energized gas such as a plasma or a microwave activated gas.

In the etching process, a film of etchant residue often forms on surfaces around the substrate, for example on the walls, components and other internal surfaces of the chamber. It is difficult to clean the etchant residue especially when the composition of the etchant residue varies across the chamber. The etchant residue composition depends upon the composition of the process gas, the material being etched, and the composition of the etch resistant material on the substrate. For example, when tungsten silicide, polysilicon or other silicon-containing layers are etched, vaporized or sputtered silicon-containing species form a large component of the etchant residue. In addition, the etch resistant material may also be partially vaporized to form gaseous hydrocarbon or oxygen species that become part of the etchant residue. The chemical composition of the etchant residue may also vary considerably also depending upon the local gas environment, the location of gas inlet and exhaust ports, and the spatial geometry of the chamber. The etchant residue is undesirable because it can flake off during processing and contaminate or otherwise alter the characteristics of the surfaces on which it deposits.

In a conventional process, the etch ant residue is periodically cleaned off the surfaces in the chamber. For example, in one method, after processing a batch of substrates, a dry-cleaning process is used to clean the chamber surfaces with an energized cleaning gas. However, when the energized cleaning gas is not sufficiently reactive to the etchant residue, slow and inefficient cleaning rates are obtained; and when the energized cleaning gas is too chemically aggressive it can erode the chamber walls and components. It is also difficult to control the composition and energy level of the cleaning gas to achieve the conflicting goals of high rates of removal of the etchant residue, uniform cleaning and of chamber surfaces and reduced erosion of chamber surfaces.

In another method, the cleaning gas is added to the etchant gas, and the resultant gas composition is energized to both etch the substrate and clean the surfaces in the chamber. However, it is often difficult to etch compositionally different portions of a substrate at similar etch rates using the combined gas. For example, when etching p-doped and n-doped regions in the fabrication of p-channel and n-channel CMOS transistors in symmetrical matched pairs, it is difficult to etch both doped regions at the same etch rates with the combined energized gas. Variations in their etch rates can cause the two regions to be etched to different depths.

Thus it is desirable to have an etching process that may be used to clean-off etchant residue formed on the internal surfaces of the chamber without excessive erosion of the chamber surfaces. It is also desirable for the etching process to etch compositionally different regions on the substrate at similar etch rates. It is further desirable to etch material on the substrate with a high etching selectivity to a mask or underlayer.

SUMMARY

The present invention satisfies these needs. One aspect of the present invention comprises a method of etching a silicon-containing material in a substrate, the method comprising placing the substrate in a process chamber and providing in the process chamber an energized gas comprising fluorine-containing gas, chlorine-containing gas and sidewall-passivation gas.

Another aspect is a method of etching a substrate in a process chamber while simultaneously cleaning surfaces in the process chamber, the method comprising placing the substrate in the process chamber, the substrate comprising a silicon-containing material having a plurality of dopant concentrations or dopant types, and providing in the process chamber, an energized process gas comprising fluorine-containing gas, chlorine-containing gas and sidewall-passivation gas, whereby the plurality of dopant concentrations or dopant types in the silicon-containing material, are etched at substantially similar rates.

Yet another aspect is a process chamber comprising a substrate support, a gas source for providing process gas comprising fluorine-containing gas, chlorine-containing gas, and sidewall-passivation gas, a gas energizer, and a gas exhaust, whereby a substrate received on the support may be processed by process gas provided by the gas source, energized by the gas energizer, and exhausted by the gas exhaust.

DRAWINGS

While the description, drawings, and appended claims below illustrate exemplary features of the invention, it is to be understood that each of the features can be used in the invention in general, not merely in the context of the particular drawings, and the invention includes any combination of these features:

DESCRIPTION

Figure 1:
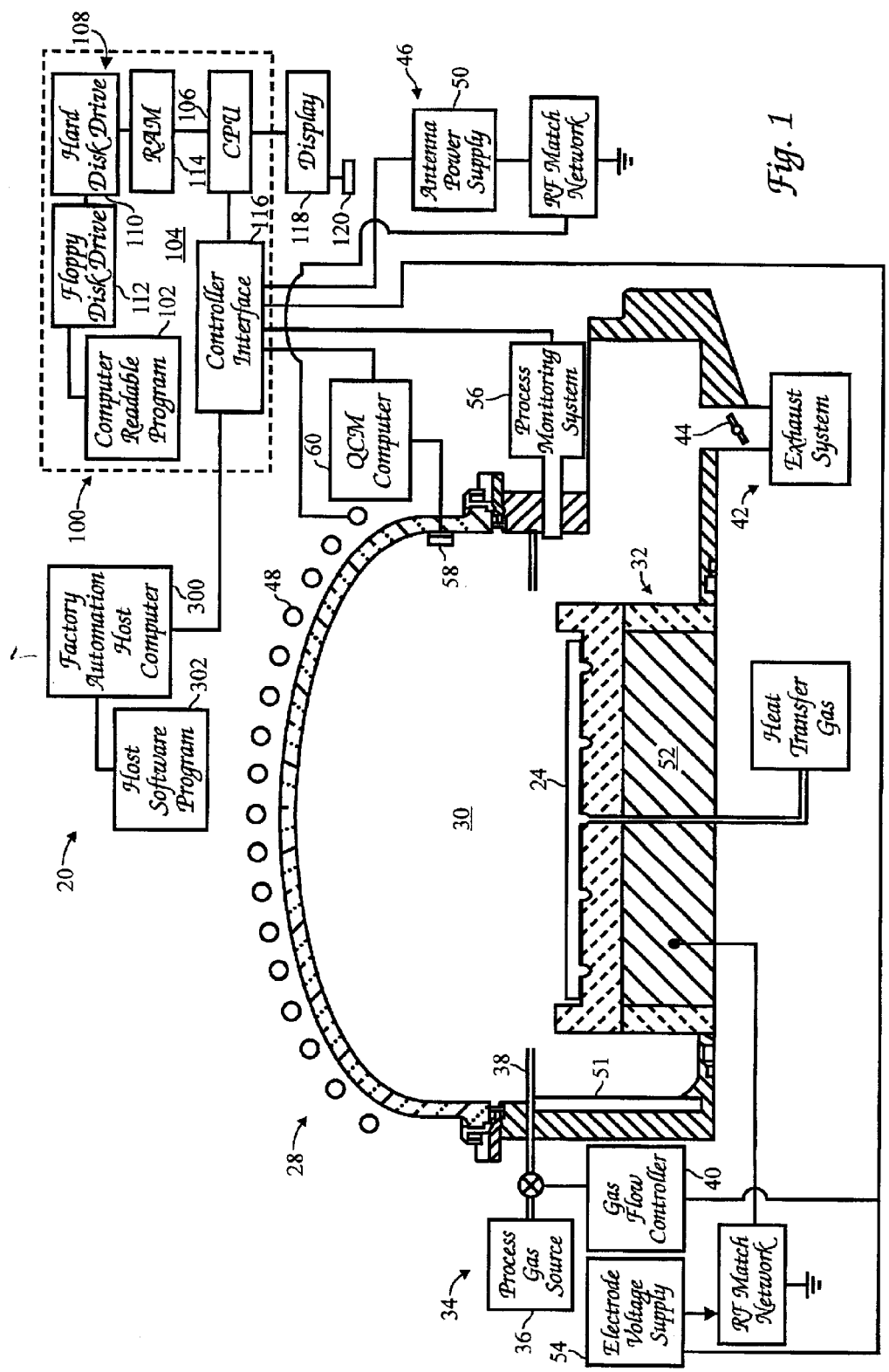
FIG. 1 is a sectional schematic side view of an apparatus according to the present invention.

The present invention is capable of cleaning an etchant residue formed on surfaces 51 in a chamber 28 while etching a substrate 24 having compositionally different regions at similar etch rates and with a high selectivity to a mask or underlayer. Typically, the substrate 24 comprises, for example, a semiconductor such as silicon, a compound semiconductor such as gallium arsenide, or a dielectric such as silicon dioxide. Silicon-containing material, such as silicon dioxide, silicon nitride, polysilicon, metal silicide, and monocrystalline silicon, may be formed on the substrate 24. The substrate 24 is etched with an energized gas, such as for example, a dissociated gas or a plasma, that comprises cleaning components that clean—by removing or preventing the formation of—etchant residue on the chamber surfaces, and the etchant gas components etch the substrate 24.

A process gas according to the present invention comprises a fluorine-containing gas, a chlorine-containing gas, and a sidewall-passivation gas. It has been discovered that this combination of gases is capable of etching compositionally different regions on the substrate 24 at similar etch rates, while also cleaning the etchant residue deposited on adjacent chamber surfaces 51 at efficient cleaning rates and with reduced erosion. The fluorine-containing gas contains elemental fluorine (F) and may also contain other elements. For example, suitable fluorine-containing gases include $NF_3$, $CF_4$ and $SF_6$. These gases have a high ratio of fluorine to other species which may provide in a relatively large quantity of dissociated or ionized fluorine species in the energized gas. The fluorine species cleans the etchant residue on the chamber surfaces. The fluorine species also causes less erosive damage to the chamber surfaces compared to conventional plasma cleaning processes. A preferred fluorine-containing gas comprises $CF_4$, which provides good cleaning etchant residues on chamber surfaces, especially etchant residues containing oxide species such as silicon dioxide.

The chlorine-containing gas contains elemental chlorine (Cl) and may also contain other elements. It is believed that the chlorine-containing gas functions as the primary etchant for etching the silicon-containing material on the substrate 24. The chlorine-containing gas may be ionized or dissociated to form atomic chlorine and chlorine-containing species that etch silicon-containing material. For example, polysilicon is etched by chlorine-containing ions and neutrals to form volatile $SiCl_2$ species that are exhausted from the process chamber 28. The chlorine-containing gas can comprise $Cl_2$, or other chlorine-containing gases that are equivalent to chlorine, for example, HCl, $BCl_3$, and mixtures thereof. For etching polysilicon, $Cl_2$ is preferred because it provides good etching rates.

The process gas further comprises a sidewall passivation gas which provides gaseous or condensate species that form passivating deposits upon the sidewalls of freshly etched features. Suitable sidewall-passivation gases, include for example, nitrogen, hydrogen and carbon monoxide; of which nitrogen is preferred. Generally the volumetric flow ratio of fluorine-containing gas and chlorine-containing gas to sidewall passivation gas is from about 1:1 to about 10:1. This ratio provides a good balance among etch rate, uniformity, profile and chamber surface cleaning efficiency.

The process gas is also substantially absent a bromine-containing gas. The bromine-containing gas reduces the formation of hydrocarbon etching deposits formation on chamber wall. Hydrocarbon based polymer can be formed when HBr is mixed with $CF_4$ for example. The presence of such polymer formation has serious impact on process performance and chamber wall environment. The absence of hydrogen bromine reduces the constraints in balancing between the process on wafer results and chamber wall deposits. It has been discovered that the presence of a bromine-containing gas in the process gas mixture, such as for example, HBr, Br, or $CH_3Br$, can reduce etching uniformity, especially when etching compositionally different materials on the substrate. It has been discovered that the bromine-containing species that are formed in the energized process gas from the bromine-containing gas, etch the compositionally different regions of the silicon-containing material in the substrate at widely varying etching rates. This is because the electron affinities of compositionally different regions of substrate (for example, that contain different levels or types of dopants) can widely differ. It is believed that this difference in electron affinity more strongly affects the rate of etching provided by bromine-containing species. Thus, adding a bromine-containing gas to the process gas results in increased sensitivity to compositional variations in the substrate, and consequently, a more pronounced difference in etching rates across these portions of the substrate.

In contrast, it has been discovered that the smaller and more reactive fluorine-containing species provides more uniform etching rates for the compositionally different regions. The volumetric flow ratio of fluorine-containing gas to chlorine-containing gas also controls the uniformity of etching of the compositionally different regions on the substrate. This is because the fluorine-containing species are less susceptive to the differences in electron affinity of the compositionally different regions. Thus, increasing the fluorine-containing gas provides less sensitivity towards different doping composition, while an increased volume of chlorine-containing gas provides more sensitivity to the doping composition. The ratio of the fluorine-containing gas to the chlorine-containing gas is controlled to provide etching rates for the compositionally different regions that differ by less than 5%—or that may even be substantially similar or equal. The volumetric flow ratio of the fluorine-containing gas to the chlorine-containing gas and the other gas constituents also controls cleaning of the etchant residue, the higher the content of the fluorine-containing gas the more effective is the etchant residue cleaning. It has been discovered that a suitable volumetric flow ratio of fluorine-containing gas to chlorine-containing gas that provides high etching uniformity and good etchant residue cleaning rates, is from about 2:1 to about 8:1. The volumetric flow ratio of fluorine-containing gas to chlorine-containing gas also controls the shape or profile of etched features. For example, increased chlorine content provides etching of features having a more reentrant profile and higher etch rates. For etching features having an anisotropic profile in polysilicon, a suitable volumetric flow ratio of fluorine-containing gas to chlorine-containing is from about 3:1 to about 7:1, and more preferably is about 5:1.

While the process gas of the first or main etching stage is absent a bromine-containing gas in the process gas mixture, such as for example, HBr, Br or $CH_3Br$ gas, to provide better cleaning efficiency and to etch the compositionally different regions at similar etch rates; it has been further discovered that when the etching selectivity to an underlayer below the material being etched is important, optionally, a second energized gas composition may be used to etch any remaining portion of material left on the substrate, after the first or main etching stage. In the second stage, when for example, polysilicon overlying silicon dioxide is being etched, a second gas composition that includes a bromine-containing gas in the process gas mixture, such as for example, HBr, Br or $CH_3Br$ gas, may be advantageously used. In one composition, the second energized gas composition comprises HBr and one or more of $Cl_2$, He—$O_2$ and $CF_4$. This gas composition provides good etching selectivity for etching polysilicon over silicon dioxide, thereby reducing overetching of the underlayer when the polysilicon is nearing completion of etching.

The first or second process gas may be energized by coupling electromagnetic energy, such as RF or microwave energy, to the process gas. This may be done by inductively coupling RF energy to the gas in a process zone or in a remote zone (that is distal from the process zone), for example, by an inductor source, such as an inductor antenna. In addition, or as an alternative, the process gas may be energized by capacitively coupling RF energy to the gas by process electrodes that are electrically biased relative to one another. In yet another example, the gas may be energized by applying microwave energy to the gas in a remote zone or in the process zone.

An apparatus 20 according to the present invention that is suitable for etching the substrate 24 is schematically illustrated in FIG. 1. Generally, the apparatus 20 comprises a chamber 28 having a process zone 30 for processing a substrate 24 and a support 32 to receive the substrate 24. Process gas may be introduced into the chamber 28 through a gas supply 34 comprising a gas source 36, gas outlets 38 located around the periphery of the substrate 24 (as shown) or in a showerhead mounted on the ceiling of the chamber (not shown), and a gas flow controller 40 is used to control the flow rate of the process gas. Spent process gas and etchant byproducts are exhausted from the chamber 28 through an exhaust 42 comprising roughing and turbomolecular pumps (not shown) and a throttle valve 44 may be used to control the pressure of process gas in the chamber 28.

An energized gas or plasma is generated from the process gas by a gas energizer 46 that couples electromagnetic energy, such as RF or microwave energy, to the process gas in the process zone 30 of the chamber 28, such as for example, an inductor antenna 48 comprising one or more coils powered by an antenna power supply 50 that inductively couples RF energy to process gas in the chamber 28. In addition or as an alternative chamber design, a first process electrode 51 such as an electrically grounded sidewall or ceiling of the chamber 28 and a second electrode such as an electrically conducting portion of the support 32 below the substrate 24 may be used to further energize the gas in the chamber 28. The first and second electrodes 51, 52 are electrically biased relative to one another by an RF voltage provided by an electrode voltage supply 54. The frequency of the RF voltage applied to the Inductor antenna 48 and/or to the electrodes 51, 52 is typically from about 50 kHz to about 60 MHz.

The chamber 28 further comprises a process monitoring system 56 to monitor the process being performed on the substrate 24. The process monitoring system 56 may monitor, for example, an emission from a plasma generated inside the chamber 28, the plasma emission being generally multispectral, i.e., providing radiation having multiple wavelengths extending across a spectrum. In addition, quartz crystal microbalance (QCM) 58 may be used to determine the amount of etchant residue deposited on chair surface during the etching process. Generally, the microbalance 58 is a piezoelectric plate that changes capacitance when enchant residue is deposited on the plate. The microbalance 58 is mounted on an internal surface in the chamber 28, such as a chamber sidewall, and connected to a QCM computer 60 outside the chamber 28.

To perform the process of the present invention, the substrate 24 is placed on the support 32 in the chamber 28, and the chamber 28 is evacuated. Process gas is introduced into the chamber 28 by the gas delivery system 34, and the gas flow controller 40 and throttle valve 44 are adjusted to maintain the desired gas flow rates and pressure in the chamber 28. The gas energizer 46 forms an energized process gas that processes the substrate 24. Typically, process gas is energized by applying a RF source power level of about 200 to about 2000 Watts, and an RF bias power level of about 5 to 500 Watts.

The chamber 28 is operated by a controller 100 that executes a computer-readable process control program 102 on a computer system 104 comprising a central processor unit (CPU) 106, such as for example a 68040 microprocessor, commercially available from Synergy Microsystems, California, or a Pentium Processor commercially available from Intel Corporation, Santa Clara, California, that is coupled to a memory 108 and other computer components. The memory 108 comprises a computer-readable medium having the computer-readable program 102 embodied therein. Preferably, the memory 108 includes a hard disk drive 110, a floppy disk drive 112, and random access memory (RAM) 114. The controller 100 further comprises one or more controller interfaces card 116 that include, for example, analog and digital input and output boards, interface boards, and motor controller boards. An operator communicates with the controller 100 by, for example, a display 118, such as a CRT or flat panel monitor, and a light pen 120. The light pen 120 detects light emitted by the display 118 with a light sensor in the tip of the light pen 120. To select a particular screen or function, an operator touches a designated area of a screen on the display 118 and pushes the button on the light pen 120. Typically, the area touched changes color, or a new menu is displayed, confirming communication between the operator and the controller 100.

Figure 2:
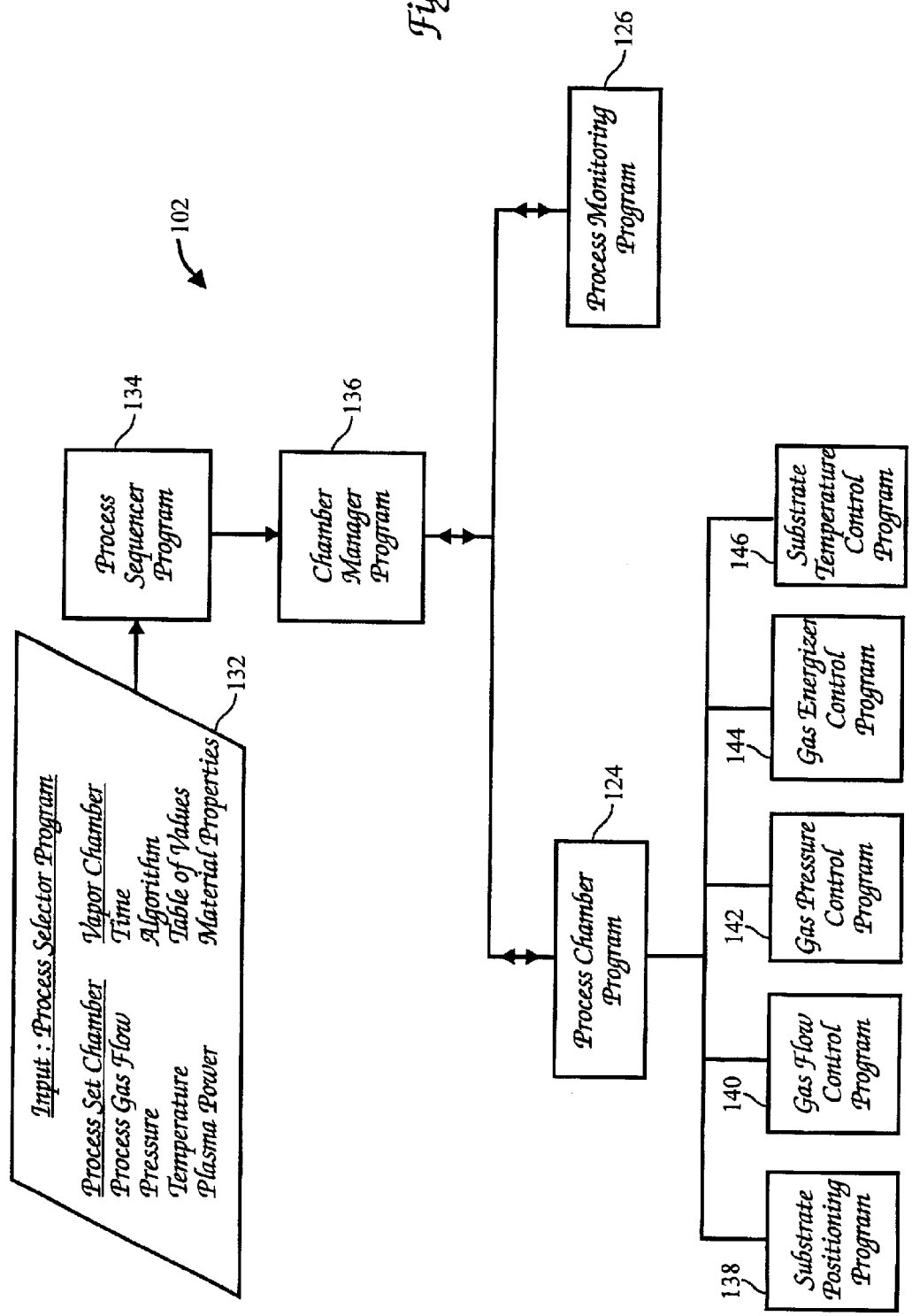
FIG. 2 is an exemplary illustrative block diagram of a computer program suitable for operating the chamber and monitoring a process performed therein.

FIG. 2 provides an exemplary block diagram of a hierarchical control structure of an embodiment of a computer-readable process control program 102 according to the present invention. The process control program 102 may be stored in the memory 108, such as for example, a floppy disk or other computer program product inserted in a floppy disk drive 112, hard disk drive 110 or other appropriate drive. The program 102 may be written in a conventional computer-readable programming language, such as for example, assembly language, C++, Pascal or Fortran. Suitable program code is entered into a single file, or multiple files, using a conventional text editor and stored or embodied in computer-usable medium of the memory 108 of the controller 100. If the entered code text is in a high level language, the code is compiled, and the resultant compiler code is then linked with an object code of precompiled library routines. To execute the linked, compiled object code, the user invokes the object code, causing the CPU 106 to read and execute the code to perform the tasks identified in the program 102.

Generally, the program 102 comprises an input process selector program 132, a process sequencer program 134, and a chamber manager program 136. Using the light pen interface 120, a user may enter a process set, process parameters, and a chamber number into the process selector program 132 in response to menus or screens displayed on the display 118. The process sets are predetermined groups of process parameters necessary to carry out specified processes. The process parameters are process conditions, including without limitations, gas composition, gas flow rates, temperature, pressure, gas energizer settings such as RF or microwave power levels, cooling gas pressure, and wall temperature. The chamber number is the designated number of a particular chamber on a platform containing multiple chambers. In addition, parameters needed to operate the process monitoring system 56 may also inputted into the process selector program 132.

The process sequencer program 134 comprises program code to accept the chamber type and set of process parameters from the process selector program 132 and to control operation of the chamber 28. The sequencer program 134 initiates execution of the process set by passing the particular process parameters to a chamber manager program 136 that controls multiple processing tasks in a chamber 28 and typically includes a process chamber program 124 and a process monitoring program 126. The process chamber program 124 includes program code to set the timing, gas composition, gas flow rates, chamber pressure, chamber temperature, RF power levels, support position, heater temperature, and other parameters of a particular process. Typically, the process chamber program 124 includes a substrate positioning program 138, a gas flow control program 140, a gas pressure control program 142, a gas energizer control program 144, and a substrate temperature control program 146. Typically, the substrate positioning program 138 comprise program code for controlling chamber components that are used to load the substrate 24 onto the support 32 and optionally, to lift the substrate 24 to a desired height in the chamber 28 to control the spacing between the substrate 24 and the gas outlets 38 of the gas delivery system 34. The gas flow control program 140 has program code for controlling the flow rates of different constituents of the process gas. The gas flow control program 140 may also control the open/close position of the safety shutoff valves, and ramp up/down the gas flow controller 40 to obtain the desired gas flow rate. For example, the gas flow control program 140 may be used to set the flow rates of the different gases or to exclude particular gases from the gas composition. The pressure control program 142 comprises program code for controlling the pressure in the chamber 28 by regulating the aperture size of the throttle valve 44 in the exhaust system 42, the gas energizer control program 144 comprises program code for setting low and high-frequency RF power levels applied to the process electrodes 51, 52. Optionally, the substrate temperature control program 146 comprises program code for controlling the temperature of a heater element used to heat the support 32 and substrate 24; or the flow rate and temperature of fluid circulated through the support 32.

The process monitoring program 126 comprises program code that obtains sample or reference signals from the chamber 28 and processes the signal according to preprogrammed criteria. THE program 126 may also send instructions to the chamber manager program 136 or other programs to change the process conditions or other chamber settings. For example, the process monitoring program 126 may comprise program code to analyze an incoming signal trace provided by the process monitoring system 56 and determine a process endpoint or completion of a process stage when a desired set of criteria is reached, such as when an attribute of the detected signal is substantially similar to a pre-programmed value. The process monitoring program 126 may also be used to detect a property of a material being processed on the substrate 24, such as a thickness, or other properties, for example, the crystalline nature, microstructure, porosity, electrical, chemical and compositional characteristics of the material on the substrate 24. Upon detecting an onset or completion of a process, the process monitoring program signals the process chamber program 126 which sends instructions to the controller 100 to change a process condition in a chamber 28 in which the substrate 24 is being processed. The controller 100 is adapted to control one or more of the gas delivery system 34, plasma generator 46, or throttle valve 44 to change a process condition in the chamber 28 in relation to the received signal.

Referring to FIG. 1, the data signals received by and/or evaluated by the controller 100 may also be sent to a factory automation host computer 300. The factory automation host computer 300 may comprise a host software program 302 that evaluates data from several platforms or chambers 28, and for batches of substrates 24 or over an extended period of time, to identify statistical process control parameters of (i) the processes conducted an the substrates 24, (ii) a property that may vary in a statistical relationship across a single substrate 24, or (iii) a property that may vary in a statistical relationship across a batch of substrates 24. The host software program 302 may also use the data for ongoing in-situ process evaluations or for the control of other process parameters. A suitable host software program comprises a WORKSTREAM™ software program available from aforementioned Applied Materials. The factory automation host computer 300 may be further adapted to provide instruction spinals to (i) remove particular substrates 24 from the processing sequence, for example; if a substrate property is inadequate or does not fall within a statistically determined range of values, or if a process parameter deviates from an acceptable range; (ii) end processing in a particular chamber 28, or (iii) adjust process conditions upon a determination of an unsuitable property of the substrate 24 or process parameter. The factory automation host Computer 300 may also provide the instruction signal at the beginning or end of processing of the substrate 24 in response to evaluation of the data by the host software program 302.

EXAMPLES

The following examples illustrate exemplary applications of the present invention for etching a substrate 24 and cleaning etchant residue off the surfaces of a chamber 28, the invention may be used in other applications as would be apparent to those skilled in the art, and the scope of the present invention should not be limited to the illustrative examples provided herein. In these examples, a blanket layer of polysilicon was etched to expose a thin underlayer of silicon dioxide on a substrate 24. The polysilicon comprised a plurality of (n or p) doped or undoped regions, and an etch-resistant material patterned on the polysilicon. The substrates 24 were etched and measurements were made to determine the thickness of polysilicon removed by the etching process, the thickness of silicon dioxide remaining, etching rates, etching uniformity, and the etching ratio selectivity for etching polysilicon relative to overlying resist or underlying silicon dioxide. The etch rate uniformity for etching doped and undoped polysilicon was determined from: (doped etch rate)/(undoped etch rate). Etching rates were measured with an interferometer, such as a Prometrix UV 1050. The etch chamber was a DPS chamber from Applied Materials, Inc., Santa Clara, Calif., as described herein.

Examples 1 to 3

Absence of HBr

Table I shows comparative examples 1 to 3 that demonstrate that a process gas which is absent HBr and which has a suitable volumetric flow ratio of fluorine-containing gas to chlorine-containing gas, provides better etching and chamber cleaning than process gas containing HBr. Example 1 used a process gas composition comprising 100 sccm $CF_4$, 20 sccm $Cl_2$, and 30 sccm $N_2$, a gas pressure of 4 mTorr, a source power of 450 watts and a bias power of 70 watts. Example 2 used a process gas composition comprising 60 sccm $Cl_2$, 120 sccm HBr, and 16 sccm He—$O_2$; a gas pressure of 4 mTorr, a source power of 475 watts, and a bias power of 80 watts. Example 3 used a process gas comprising 25 sccm $CF_4$, 60 sccm $Cl_2$, 120 sccm HBr, and 16 sccm He—$O_2$; a gas pressure of 4 mTorr; a source power of 475 watts; and a bias power of 80 watts. In these examples, the substrate was maintained at a temperature of about 50° C.

Table I also shows the doped and undoped etching rates as well as the ratio of the doped/undoped etching rates. For example 1, which did not contain HBr, the etch rate is highly uniform and the ratio of the doped to undoped etch rate is 1.01 very close to the ideal value of 1. Example 2, which contained $Cl_2$, HBr, and He—$O_2$ provided etching rates that were less uniform with a doped/undoped etch rate ratio of 1.11 which is about an 11% difference in etch rate. Example 3 which contained $CF_4$, $Cl_2$, HBr and He—$O_2$ provided etch rates that were also not very uniform and with a doped/undoped etch rate ratio of 1.09—about a 9% difference in etch rates.

TABLE 1

| Example No. | Process Gas | Doped Etch Rate (Å/min) | Undoped Etch Rate (Å/min) | Doped/ Undoped Etch Rate Ratio |
|---|---|---|---|---|
| 1 | $CF_4/Cl_2/N_2$ | 1720 | 1700 | 1.01 |
| 2 | $Cl_2/HBr/HeO_2$ | 2077 | 1844 | 1.11 |
| 3 | $CF_4/HBr/Cl_2HeO_2$ | 2161 | 1987 | 1.09 |

Table I demonstrates that prior art etching gas compositions that contain a bromine-containing gas, such as HBr, provide significant differences in etching rates of doped/undoped polysilicon on a substrate. In contrast, a process gas which is absent HBr, provides unexpectedly uniform etching rate uniformity for etching doped/undoped polysilicon, high etching rates for the polysilicon, and a clean chamber environment.

Example 4

Uniformity for Dense & Isolated Features

Table II demonstrates that the uniform etching rates obtained for both dense and isolated feature regions on a substrate. In this example (4), the process parameters were 100 sccm $CF_4$, 20 sccm $Cl_2$, and 30 sccm $N_2$; gas pressure 4 mtorr; source power 450 watts, bias power 70 watts; and substrate temperature 50° C. The critical dimension (CD bias) uniformity (at one sigma standard deviation) demonstrates that less than 3 nm of the CD bias for different features in dense and isolated regions and different line widths (0.18 or 0.25 microns) can be obtained. The etch rate uniformity is also demonstrated for features at both the 0.18 and the 0.25 micron sizes because the same critical dimension control for different line width was required. Generally, the etching uniformity factor was about two times better than that provided by conventional etching processes.

TABLE II

| CD Bias (μm) | dense 0.18 μm | isolated 0.18 μm | dense 0.25 μm | isolated 0.25 μm |
|---|---|---|---|---|
| Average: | 0.0043 | 0.0010 | 0.0070 | 0.0034 |
| μ loading: (isolated-dense) | −0.0027 | | −0.0036 | |
| 1δ | 0.0029 | 0.0034 | 0.0046 | 0.0042 |

Examples 5–17

Etch Rate Uniformity

Table III shows the polysilicon etch rate and the etch rate uniformity for examples 5 to 17 for etching blanket undoped polysilicon on a silicon substrate in a DPS chamber. The process variables included gas pressure (4, 12 or 20 mTorr), source power (600 or 800 watts), bias power (70 or 100 watts), $CF_4$ flow rate (50 or 100 sccm), and $Cl_2$ flow rate (0, 10, 20, 40 or 100 sccm). It is seen that the optimal etch rate and uniformity was at about 10:1 to 3:1 volumetric flow ratio of $CF_4$, to chlorine.

TABLE III

| Example No. | Pressure (mTorr) | Ws (Watts) | Wb (Watts) | $CF_4$ (sccm) | $Cl_2$ (sccm) | Polysilicon Etch Rate (Å/min) | Etch Rate Uniformity (1δ) |
|---|---|---|---|---|---|---|---|
| 5 | 4 | 600 | 70 | 100 | 0 | 1161 | 3.8 |
| 6 | 4 | 600 | 70 | 100 | 10 | 1670 | 1.6 |
| 7 | 4 | 600 | 70 | 100 | 20 | 1913 | 1.9 |
| 8 | 4 | 600 | 70 | 100 | 40 | 2127 | 2.7 |
| 9 | 4 | 600 | 100 | 100 | 0 | 1296 | 4.3 |
| 10 | 4 | 600 | 100 | 100 | 100 | 2426 | 2.8 |
| 11 | 4 | 600 | 100 | 50 | 100 | 2406 | 5.4 |
| 12 | 12 | 600 | 100 | 100 | 0 | 1482 | 5.8 |
| 13 | 12 | 600 | 100 | 100 | 20 | 2188 | 2.1 |
| 14 | 12 | 600 | 100 | 100 | 40 | 2180 | 5.8 |
| 15 | 12 | 800 | 100 | 100 | 40 | 2738 | 1.5 |
| 16 | 20 | 600 | 100 | 100 | 20 | 1974 | 5.2 |
| 17 | 20 | 800 | 100 | 100 | 20 | 2388 | 1.9 |

Figure 3:
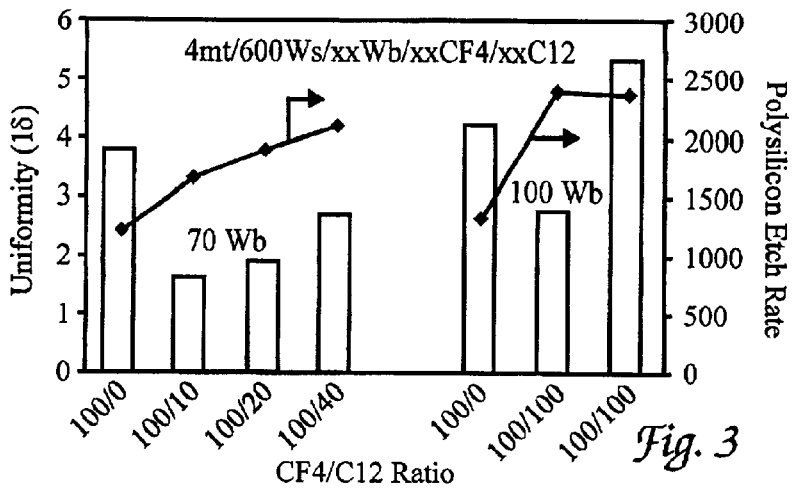
FIGS. 3 and 4 are graphs showing the polysilicon etch rate uniformity (1δ) and etch rates obtained for different $CF_4/Cl_2$ volumetric flow ratios.

FIG. 3 shows the etch rate uniformity (1δ) (bars) and etching rate (line) obtained for increasing volumetric flow ratios of $CF_4/Cl_2$ and for increasing RF bias power. This figure plots the results of examples 5 to 11, in which the source power was held at 600 watts and the helium backside gas pressure was maintained at 4 Torr. It is seen that the 1δ initially decreases then gradually increases for increasing $CF_4/Cl_2$ ratio, indicating that there is an optimal process window to balance etch rate and uniformity. In addition, the optimal condition for etch rate and uniformity overlaps with the process region where anisotropically etched profiles were obtained.

Figure 4:
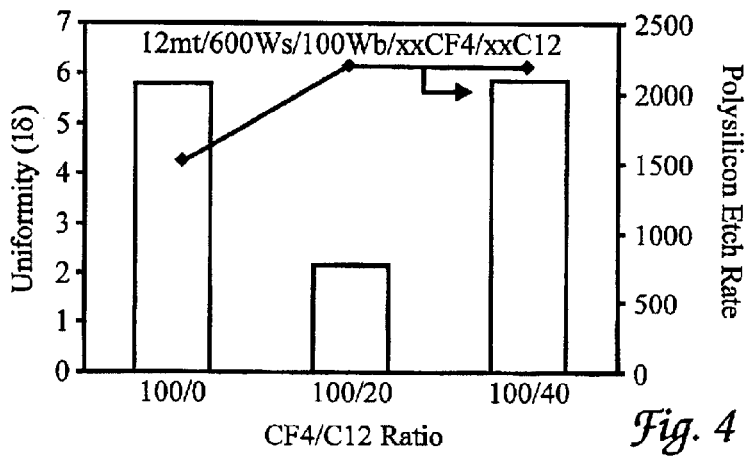

As shown in FIG. 4, the addition of a $Cl_2$ to a $CF_4$ based gas chemistry that is absent HBr had a significant effect on the polysilicon etch rate and uniformity. The bars represent the etch rate uniformity and the line represents the etch rate. This figure plots the results of examples 12 to 15, in which the source power was held at 600 watts, the bias power at 100 watts, and the helium backside gas pressure maintained at 12 Torr. Adding 20 sccm of $Cl_2$ (in 100 sccm of $CF_4$) increased the polysilicon etch rate nearly 70%, and improved uniformity from greater than 5 (1δ) to less than 2 (1δ). However, further increasing the $Cl_2$ flow to 40 sccm did not change the etch rate but degraded etch rate uniformity back to about 5 to 6. These results Indicate that a balanced $CF_4$ to $Cl_2$ ratio provides both high etch rates as well as good etching uniformity. The optimal gas ratio also depends on the gas composition. Good etch rate uniformity can be obtained with $CF_4/Cl_2$ gas ratio ranging from 1:1 to 5:1 at 4mTorr, while the gas ratio was limited to around 5:1 at a higher pressure of 12 mTorr. At higher gas pressure, source power became a dominating factor in uniformity control, with improved uniformity at a high source power.

Also, for the $CF_4/Cl_2/N_2$ processes, it was found that the ratio of the source power level to the bias power level was the main parameter to improve the photoresist etching selectivity ratio. Increasing source power to bias power ratio improved the polysilicon to photoresist etching selectivity ratio about 20%, which translated to a loss of about 200 Å of photoresist while etching away about 1000 Å of polysilicon.

Examples 18 to 20

Nitrogen Addition

Figure 5:
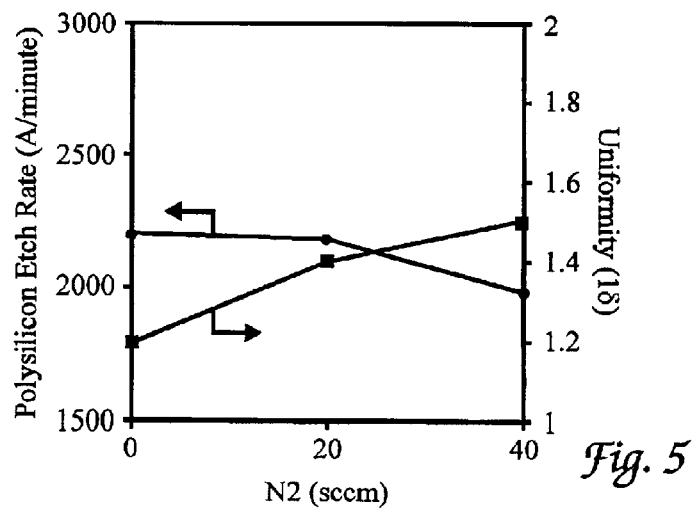
FIG. 5 is a graph showing the polysilicon etch rate uniformity (1δ) and etch rate for different $N_2$ flow rates.

As demonstrated in Table IV and FIG. 5, the addition of 20 sccm of $N_2$ to the process gas reduced the polysilicon etch rate and decreased the etching uniformity by small amounts. Increasing the $N_2$ flow rate to 40 sccm caused the polysilicon etch rate to drop by 10%. However, $N_2$ was added to provide sidewall passivation source to provide an anisotropically etched feature profile.

TABLE IV

| Example No. | $N_2$ (sccm) | Polysilicon Etch Rate (Å/min) | Uniformity (1δ) |
|---|---|---|---|
| 18 | 0 | 2210 | 1.2 |
| 19 | 20 | 2187 | 1.4 |
| 20 | 40 | 1986 | 1.5 |

Example 21

Multistage Process

In Example 21, multiple stages were used to efficiently and uniformly etch doped/undoped polysilicon on a substrate without etching through a thin underlying silicon dioxide layer. In a first etching stage, most of the thickness of the polysilicon etch-resistant material was etched while simultaneously cleaning the chamber of etchant residue. The energized gas composition included fluorine-containing gas, chlorine-containing gas, and sidewall-passivation gas, and was absent bromine-containing gas. The main etching stage used the process conditions shown in Table V. The first stage was stopped before the polysilicon was completely etched through using optical emission analysis in which the emission spectra of the energized gas in the chamber was analyzed to determine a change in chemical composition that corresponded to a change in chemical composition of the layer being etched. This stage provided uniform etching of the compositionally different regions and also cleaned etchant residues from the chamber surfaces.

TABLE V

| Pressure (mTorr) | Source power (watts) | Bias power (watts) | $CF_4$ (sccm) | $Cl_2$ (sccm) | $N_2$ (sccm) | Backside He Pressure (Torr) | Cathod temp. °C. | Wall temp. °C. | Dome temp. °C. |
|---|---|---|---|---|---|---|---|---|---|
| 4 | 450 | 70 | 100 | 20 | 30 | 8 | 50 | 80 | 80 |

After the first etch, a pump-out stage was performed to exhaust the gases used in the main etch stage from the chamber 28. In this stage, the chamber 28 was pumped down to a low pressure of from about 0.5 mTorr to about 10 mTorr, for about 5 to about 15 seconds. It is desirable to remove the fluorine-containing gas from the chamber in this stage. Optionally, a low flow of an inert purge gas, such as nitrogen, was introduced during the pump-out stage, to dilute the remaining fluorine-containing gas in the chamber 28 and prevent back-streaming of oil from the vacuum pump, for example, at a flow rate of from about 50 to about 100 sccm.

After the pump-out step, a second or overetch stage was performed in which the remaining polysilicon was etched. In the second stage, a second process gas, containing bromine-containing gas, was energized to etch the polysilicon. In this stage, the process gas composition was altered to provide higher etching selectivity for etching polysilicon over silicon dioxide. In this stage, the composition of the energized gas was altered to a gas comprising, for example, $Cl_2$, HBr, and He—$O_2$. The volumetric flow ratio was selected to etch the polysilicon material at high etch rates and at a high etching selectivity relative to the underlying silicon dioxide. The source power was between 300–800 watts, bias power 20–80 watts, chamber pressure 4–20 mTorr, and substrate temperature 50° C.

Thus, the multistage process included a first stage in which the process gas was absent a bromine-containing gas, such as HBr gas, which provided a clean etching process with uniform etch rates across compositionally different regions of the substrate; and a second stage where a bromine-containing gas such as HBR gas was added to provide a higher etching selectivity to an underlying layer, such as an $SiO_2$ layer, especially during the etching of polysilicon material. The second gas composition may be altered for etching of other combinations of overlying and underlying materials as would be apparent to one of ordinary skill in the art.

The present invention provides numerous advantages over conventional processes for etching materials and maintaining chamber surfaces free of etchant residues. Uniform and consistent etching rates were obtained for etching silicon-containing material having regions with different concentrations or compositions of dopant or other materials. Etching rate variations of less than 5% were obtained in contrast to conventional gas composition that typically provide etching rates more than 20%. Moreover, little or no etchant residues remained on chamber surfaces even after etching of the substrate and the etchant residues appear to be uniformly cleaned from the chamber surfaces even when the thickness or chemical stoichiometry of the etchant residues varied across the chamber.

The invention has been described with reference to certain preferred versions thereof; however, other versions are possible. For example, the present invention can be used in other chambers and applications, as would be apparent to one of ordinary skill. For example, the invention may be applied in sputtering chambers, ion implantation chambers, or deposition chambers, or in combination with other cleaning processes. Therefore, the spirit and scope of the appended claims should not be limited to the description of the preferred versions contained herein.

What is claimed is:

1. A method of etching a silicon-containing material on a substrate, the method comprising:
    placing the substrate in a process chamber, and
    providing in the process chamber, an energized gas formed by coupling RF or microwave energy to a process gas comprising fluorine-containing etching gas, chlorine-containing etching gas and sidewall-passivation gas, the sidewall-passivation gas being a gas other than the fluorine-containing etching gas, wherein the volumetric flow ratio of the fluorine-containing etching gas to the chlorine-containing etching gas is from about 2:1 to about 8:1.

2. A method according to claim 1 wherein the silicon-containing material on the substrate comprises regions having different compositions, and wherein the volumetric flow ratio of the fluorine-containing etching gas, chlorine-containing etching gas, and sidewall-passivation gas is selected to etch the regions having different compositions at substantially similar etch rates.

3. A method according to claim 2 wherein the silicon-containing material comprises polysilicon.

4. A method according to claim 3 wherein the regions having different compositions comprise dopant in a plurality of concentrations or types.

5. A method according to claim 2 wherein the substantially similar etch rates are etch rates that vary by less than about 5%.

6. A method awarding to claim 1 wherein the fluorine-containing etching gas comprises one or more of $NF_3$, $CF_4$ or $SF_6$.

7. A method according to claim 1 wherein the chlorine-containing etching gas comprises one or more of $Cl_2$ or HCl.

8. A method according to claim 1 wherein the sidewall-passivation gas comprises one or more of nitrogen, hydrogen or carbon-monoxide.

9. A method according to claim 8 wherein the volumetric flow ratio of the combined volumetric flow rate of the fluorine-containing etching gas and chlorine-containing etching gas to the volumetric flow rate of the sidewall-passivation gas is from 1:1 to about 10:1.

10. A method according to claim 1 wherein the process gas is absent HBr, $Br_2$ or $CH_3Br$.

11. A method according to claim 10 further comprising a second etch step in which an energized gas formed from a second process gas comprising HBr is provided in the process chamber.

12. A method according to claim 11 wherein the second process gas further comprises one or more of $Cl_2$, He—$O_2$ and $CF_4$.

13. A method of etching a substrate in a process chamber while simultaneously cleaning surfaces in the process chamber, the method comprising:
    placing the substrate in the process chamber, the substrate comprising a silicon-containing material having a plurality of dopant concentrations or dopant types; and
    providing in the process chamber, an energized process gas formed by coupling RF or microwave energy to a process gas comprising fluorine-containing gas, chlorine-containing gas and sidewall-passivation gas, the volumetric flow ratio of the fluorine-containing gas to the chlorine-containing gas being from about 2:1 to about 8:1, whereby the plurality of dopant concentrations or dopant types in the silicon-containing material are etched at substantially similar rates.

14. A method according to claim 13 wherein the volumetric flow ratio of the fluorine-containing gas, chlorine-containing gas and sidewall-passivation gas, is selected to etch the plurality of dopant concentrations or dopant types in the silicon-containing material at etch rates that vary by less than about 5%.

15. A method according to claim 13 comprising at least one of the following characteristics (i) the fluorine containing gas comprises one or more of $NF_3$, $CF_4$ or $SF_6$: (ii) the chlorine-containing gas comprises one or more of $Cl_2$ or HCl; or (iii) the sidewall-passivation gas comprises one or more of nitrogen, hydrogen or carbon monoxide.

16. A method according to claim 13 wherein the volumetric flow ratio of the combined volumetric flow rate of the fluorine-containing and chlorine-containing etching gas to the volumetric flow rate of the sidewall-passivation gas is from about 1:1 to about 10:1.

17. A method according to claim 16 wherein the process gas is absent HBr, $Br_2$ or $CH_3Br$.

18. A method according to claim 17 further comprising a second etch step in which an energized gas formed from a second process gas comprising HBr is provided in the process chamber.

19. A method according to claim 18 wherein the second process gas further comprises one or more of $Cl_2$, He—$O_2$ and $CF_4$.

20. A method of etching a silicon-containing material on a substrate, the method comprising:

placing the substrate in a process chamber;

in a first etching stage, providing in the process chamber, an energized gas formed from a first process gas comprising fluorine-containing etching gas, chlorine-containing etching gas and sidewall-passivation gas, the sidewall-passivation gas being a gas other than the fluorine-containing etching gas, the first process gas being absent HBr, $Br_2$ or $CH_3Br$; and in a second etching stage, providing in the process chamber, an energized gas formed from a second process gas comprising HBr, $Br_2$ or $CH_3Br$.

21. A method according to claim 20 wherein the silicon-containing material on the substrate comprises regions having different compositions, and wherein the first process gas comprises a volumetric flow ratio of fluorine-containing etching gas, chlorine-containing etching gas and sidewall-passivation gas that is selected to etch the regions having different compositions at substantially similar etch rates.

22. A method according to claim 21 wherein the silicon-containing material comprises polysilicon.

23. A method according to claim 21 wherein the regions having different compositions comprise dopant in a plurality of concentrations or types.

24. A method according to claim 21 wherein the substantially similar etch rates are etch rates that vary by less than about 5%.

25. A method according to claim 20 wherein the first process gas comprises a volumetric flow ratio of fluorine-containing etching gas to chlorine-containing etching gas that is from about 2:1 to about 8:1.

26. A method according to claim 20 wherein the fluorine-containing etching gas comprises one or more of $NF_3$, $NF_4$ or $SF_6$.

27. A method according to claim 20 wherein the chlorine-containing etching gas comprises one or more of $Cl_2$ or HCl.

28. A method according to claim 20 wherein the sidewall-passivation gas comprises one or more of nitrogen, hydrogen or carbon-monoxide.

29. A method according to claim 20 wherein the volumetric flow ratio of the combined volumetric flow rate of the fluorine-containing etching gas and chlorine-containing etching gas to the volumetric flow rate of the sidewall-passivation gas is from 1:1 to about 10:1.

30. A method according to of claim 20 wherein the second process gas comprises HBr.

31. A method according to claim 30 wherein the second process gas further comprises one or more of $Cl_2$, He—$O_2$ and $CF_4$.

32. A method of etching a substrate comprising a silicon-containing material having a plurality of dopant concentrations or dopant types, the method comprising:

placing a substrate comprising a silicon-containing material having a plurality of dopant concentrations or dopant types in a process chamber;

in a first etch step, providing in the process chamber, an energized gas formed from a first process gas comprising fluorine-containing gas, chlorine-containing gas and sidewall-passivation gas, the volumetric flow ratio of the combined volumetric flow rate of the fluorine-containing and chlorine-containing gas to the volumetric flow rate of the sidewall-passivation gas being from about 1:1 to about 10:1, wherein the volumetric flow ratio is selected such that the plurality of dopant concentrations or dopant types in the silicon-containing material are etched at etch rates that vary by less than about 5%; and in a second etch step, providing in the process chamber, an energized gas formed from a second process gas comprising HBr.

33. A method according to claim 32 comprising at least one of the following characteristics (i) the fluorine-containing gas comprises one or more of $NF_3$, $CF_4$ or $SF_6$; (ii) the chlorine-containing gas comprises one or more of $Cl_2$ or HCl; or (iii) the sidewall-passivation gas comprises one or more of nitrogen, hydrogen or carbon monoxide.

34. A method according to claim 32 wherein the second process gas further comprises one or more of $Cl_2$, He—$O_2$ and $CF_4$.

35. A method of etching a substrate comprising a silicon-containing material having a plurality of dopant concentrations or dopant types, the method comprising:

placing a substrate comprising a silicon-containing material having a plurality of dopant concentrations or dopant types in a process chamber;

in a first etching stage, providing in the process chamber, an energized gas formed from a first process gas consisting essentially of a fluorine-containing gas, a chlorine-containing gas and a sidewall-passivation gas in a volumetric flow ratio selected to etch the plurality of dopant concentrations or dopant types at etch rates that vary by less than about 5%; and in a second etching stage, providing in the process chamber, an energized gas formed from a second process gas comprising HBr, $Br_2$ or $CH_3Br$.

36. A method according to claim 35 comprising at least one of the following characteristics (i) the fluorine-containing gas comprises one or more of $NF_3$, $CF_4$ or $SF_6$; (ii) the chlorine-containing gas comprises one or more of $Cl_2$ or HCl; or (iii) the sidewall-passivation gas comprises one or more of nitrogen, hydrogen or carbon monoxide.

37. A method according to claim 35 wherein the second process gas further comprises one or more of $Cl_2$, He—$O_2$ and $CF_4$.

38. A substrate etching method comprising;

placing a substrate comprising a silicon-containing material in a process chamber, the silicon-containing material comprising at least one of silicon dioxide, silicon nitride, polysilicon and monocrystalline silicon; and etching the silicon-containing material by providing in the process chamber, an energized gas formed from a process gas comprising $CF_4$, chlorine-containing gas and sidewall-passivation gas.

39. A method according to claim 38 wherein the silicon-containing material comprises a plurality of dopant concentrations or dopant types, and wherein the volumetric flow ratio of the $CF_4$, chlorine-containing gas, and sidewall-passivation gas is selected to etch the plurality of dopant concentrations of dopant types at etch rates that vary by less than about 5%.

40. A method according to claim 38 wherein the volumetric flow ratio of $CF_4$ to the chlorine-containing gas is from about 2:1 to about 8:1.

41. A method according to claim 38 wherein the volumetric flow ratio of the combined volumetric flow rate of the $CF_4$ and chlorine-containing gas to the volumetric flow rate of the sidewall-passivation gas is from 1:1 to about 10:1.

42. A method according to claim 38 comprising at least one of the following characteristics (i) the chlorine-containing gas comprises one or more of $Cl_2$ or HCl; or (ii) the sidewall-passivation gas comprises one or more of nitrogen, hydrogen or carbon monoxide.

43. A method according to claim 38 further comprising a second etch step in which an energized gas formed from a second process gas comprising HBr is provided in the process chamber.

44. A substrate etching method comprising:
placing a substrate comprising a silicon-containing material in a process chamber, the silicon-containing material comprising at least one of silicon dioxide, silicon nitride, polysilicon and monocrystalline silicon; and
etching the silicon-containing material by providing in the process chamber, an energized gas formed by coupling RF or microwave energy to a process gas comprising fluorine-containing etching gas, chlorine containing etching gas comprising one or more of $Cl_2$ and HCl, and sidewall-passivation gas comprising a gas other than the fluorine-containing etching gas.

45. A method according to claim 44 wherein the silicon-containing material comprises a plurality of dopant concentrations or dopant types, and wherein the volumetric flow ratio of the fluorine-containing etching gas, chlorine-containing etching gas, and sidewall-passivation gas is selected to etch the plurality of dopant concentrations or dopant types at etch rates that vary by less than about 5%.

46. A method according to claim 44 wherein the volumetric flow ratio of the fluorine-containing etching gas to the chlorine-containing etching gas is from about 2:1 to about 8:1.

47. A method according to claim 44 wherein the volumetric flow ratio of the combined volumetric flow rate of the fluorine-containing etching gas and chlorine-containing etching gas to the volumetric flow rate of the sidewall-passivation gas is from 1:1 to about 10:1.

48. A method according to claim 44 comprising at least one of the following characteristics (i) the fluorine-containing etching gas comprises one or more of $NF_3$, $CF_4$ or $SF_6$; or (ii) the sidewall-passivation gas comprises one or more of nitrogen, hydrogen or carbon monoxide.

49. A method according to claim 44 further comprising a second etching step in which an energized gas formed from a second process gas comprising HBr is provided in the process chamber.

50. A substrate etching method comprising:
placing a substrate comprising a silicon-containing material in a process chamber, the silicon-containing material comprising at least one of silicon dioxide, silicon nitride, polysilicon, metal silicide and monocrystalline silicon; and
etching the silicon-containing material by providing in the process chamber, an energized gas formed from a process gas comprising $CF_4$, $Cl_2$ and $N_2$.

51. A method according to claim 50 wherein the silicon-containing material comprises a plurality of dopant concentrations or dopant types, and wherein the volumetric flow ratio of $CF_4$, $Cl_2$ and $N_2$ is selected to etch the plurality of dopant concentrations or dopant types at etch ratios that vary by less than about 5%.

52. A method according to claim 50 wherein the volumetric flow ratio of $CF_4$ to $Cl_2$ is from about 2:1 to about 8:1.

53. A method according to claim 50 wherein the volumetric flow ratio of the combined volumetric flow rate of $CF_4$ and $Cl_2$ to the volumetric flow rate or $N_2$ is from 1:1 to about 10:1.

54. A method according to claim 50 further comprising a second etch step in which an energized gas formed from a second process gas comprising HBr is provided in the process chamber.

55. A substrate etching method comprising:
placing a substrate comprising a silicon-containing material in a process chamber; and
etching the silicon-containing material by providing in the process chamber, an energized gas formed from a process gas consisting essentially of $CF_4$, $Cl_2$ and $N_2$.

56. A method according to claim 55 wherein the silicon-containing material comprises a plurality of dopant concentrations or dopant types, and wherein the volumetric flow ratio of $CF_4$, $Cl_2$ and $N_2$ is selected to etch the plurality of dopant concentrations or dopant types at etch rates that vary by less than about 5%.

57. A method according to claim 55 wherein the volumetric flow ratio of $CF_4$ to $Cl_2$ is from about 2:1 to about 8:1.

58. A method according to claim 55 further comprising a second etch step in which an energized gas formed from a second process gas comprising HBr is provided in the process chamber.

59. A substrate etching method comprising;
placing the substrate in a process chamber;
in a first etching stage, providing in the process chamber, a first energized gas formed from a first process gas comprising $CF_4$, chlorine-containing gas and sidewall-passivation gas; and
in a second etching stage, providing in the process chamber, a second energized gas formed from a second process gas comprising a bromine-containing gas.

60. A method according to claim 59 wherein the bromine-containing gas comprises HBr, $Br_2$ or $CH_3Br$.

61. A method according to claim 59 wherein the bromine-containing gas comprises HBr.

62. A method according to claim 59 comprising at least one of the following characteristics (i) the chlorine-containing gas comprises one or more of $Cl_2$ or HCl; or (ii) the sidewall-passivation gas comprises one or more of nitrogen, hydrogen or carbon monoxide.

63. A substrate etching method comprising:
placing the substrate in a process chamber; and
in a first etching stage, providing in the process chamber, a first energized gas formed by coupling RF or microwave energy to a first process a comprising fluorine-containing etching gas, chlorine-containing etching gas, and sidewall-passivation gas comprising a gas other than the fluorine-containing etching gas; and
in a second etching stage, providing in the process chamber, a second energized gas formed from a second process gas comprising bromine-containing gas.

64. A method according to claim 63 wherein the bromine-containing gas comprises HBr, $Br_2$ or $CH_3Br$.

65. A method according to claim 63 wherein the chlorine containing etching gas comprises one or more Of $Cl_2$ and HCl.

66. A method according to claim 65 wherein the bromine-containing gas comprises HBr.

67. A method according to claim 63 comprising at least one of the following characteristics (i) the fluorine-containing etching gas comprises one or more of $NF_3$, $CF_4$ or $SF_6$; or (ii) the sidewall-passivation gas comprises one or more of nitrogen, hydrogen or carbon monoxide.

68. A substrate etching method comprising:
placing the substrate in a process chamber; and
providing in the process chamber, an energized gas formed from a process gas consisting essentially of $CF_4$, $Cl_2$ and $N_2$, wherein the volumetric flow ratio of the combined volumetric flow rate of $CF_4$ and $Cl_2$ to the volumetric flow rate of $N_2$ is from about 1:1 to about 10:1.

69. A method according to claim 68 further comprising a second etching stage in which an energized gas formed from a second process gas comprising bromine-containing gas is provided in the chamber.

70. A substrate etching method comprising;

placing a substrate comprising a silicon-containing layer in a process chamber, the silicon-containing layer consisting essentially of metal silicide; and etching the silicon-containing layer by providing in the process chamber, an energized gas formed from a process gas comprising $CF_4$, chlorine-containing gas and sidewall-passivation gas.

71. A substrate etching method comprising:

placing a substrate comprising a silicon-containing layer in a process chamber, the silicon-containing layer consisting essentially of metal silicide; and etching the silicon-containing layer by providing in the process chamber, an energized gas formed by coupling RF or microwave energy to a process gas comprising fluorine-containing etching gas, chlorine containing etching gas comprising one or more of $Cl_2$ and HCl, and sidewall-passivation gas comprising a gas other than the fluorine-containing etching gas.

72. A substrate etching method comprising:

placing a substrate comprising a silicon-containing layer in a process chamber, the silicon-containing layer consisting essentially of metal silicide; and etching the silicon-containing layer by providing in the process chamber, an energized gas formed from a process gas comprising $CF_4$, $Cl_2$ and $N_2$.

* * * * *